United States Patent
Liu

(10) Patent No.: US 7,911,859 B2
(45) Date of Patent: Mar. 22, 2011

(54) DELAY LINE AND MEMORY CONTROL CIRCUIT UTILIZING THE DELAY LINE

(75) Inventor: Wei-Li Liu, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 186 days.

(21) Appl. No.: 12/409,532

(22) Filed: Mar. 24, 2009

(65) Prior Publication Data

US 2010/0157701 A1    Jun. 24, 2010

(30) Foreign Application Priority Data

Dec. 19, 2008   (TW) ............................... 97149662 A

(51) Int. Cl.
*G11C 7/00*   (2006.01)

(52) U.S. Cl. ..................... 365/194; 365/191; 365/230.08

(58) Field of Classification Search .................. 365/194, 365/191, 230.06; 327/57, 378; 331/57, 158
See application file for complete search history.

(56) References Cited

U.S. PATENT DOCUMENTS

| | | | |
|---|---|---|---|
| 6,756,853 B2 * | 6/2004 | Schmitt et al. | 331/57 |
| 7,694,202 B2 * | 4/2010 | Swanson et al. | 714/738 |
| 7,724,862 B2 * | 5/2010 | Menolfi et al. | 375/376 |
| 2003/0227333 A1 * | 12/2003 | Schmitt et al. | 331/57 |

* cited by examiner

*Primary Examiner* — Gene N. Auduong

(74) *Attorney, Agent, or Firm* — Winston Hsu; Scott Margo

(57) ABSTRACT

A delay line includes at least one delay cell, wherein the delay line utilizes at least one of the at least one delay cell to delay an input signal for generating an output signal, and the at least one delay cell is implemented by a Pseudo NMOS transistor. In addition, a memory control circuit includes a delay locked loop (DLL) having at least one delay cell. The delay locked loop utilizes at least one of the at least one delay cell to delay an input signal for generating an output signal, and the at least one delay cell is implemented by a Pseudo NMOS transistor.

19 Claims, 9 Drawing Sheets

(a)

(b)

DELAY LINE AND MEMORY CONTROL CIRCUIT UTILIZING THE DELAY LINE

BACKGROUND OF THE INVENTION

1. Field of the Invention

The present invention relates to a delay line and a memory control circuit utilizing the delay line, and more particularly, to a delay line implemented by a Pseudo NMOS transistor and a memory control circuit utilizing the delay line.

2. Description of the Prior Art

In many kinds of circuits, a delay locked loop (DLL) circuit is utilized for synchronizing clock(s) to prevent errors resulting from non-synchronization.

Please refer to FIG. 1a in conjunction with FIG. 1b and FIG. 2. FIG. 1a is a block diagram illustrating a prior art analog DLL circuit and FIG. 2 is a schematic diagram illustrating the general operation of the analog DLL circuit shown in FIG. 1a. The analog DLL circuit 100 includes a plurality of delay cells 101-107, a phase detector 109, a charge pump 111, and a loop filter 113. The delay cells 101-107 are used for delaying the input clock signal $CK_{in}$ to generate an output clock signal $CK_n$ synchronized with the input clock $CK_{in}$. The delay cells 101-107 form a delay line. Furthermore, the delay cells 101-107 generate clock signals having different delay amounts, such as $CK_1$, $CK_2$ ..., $CK_n$ as shown in FIG. 2, where each of the clock signals $CK_1$, $CK_2$ ..., $CK_n$ may be extracted from the DLL circuit if necessary. In this case, the number of delay cells is n, thus the delay amount of each delay cell 101-107 is the total delay amount between the input clock signal $CK_{in}$ and the output clock signal $CK_n$ divided by n.

The phase detector 109, the charge pump 111, and the loop filter 113 form a control circuit for controlling the delay cells 101-107. The phase detector 109 is utilized for comparing the input signal $CK_{in}$ with the output signal $CK_n$ to generate an up signal UP and a down signal DN. The up signal UP and the down signal DN inform the charge pump 111 and the loop filter 113 to generate a control voltage $V_{ctrl}$ for controlling the operation of the delay cells 101-107. Since the operation of the charge pump 111 and the loop filter 113 is well known to persons skilled in the art, further description is omitted for brevity. In this way, the delay amount of the delay cells 101-107 may be adjusted to enable the output signal $CK_n$ to synchronize with the input signal $CK_{in}$; that is, the delay amount D1 between the input clock signal $CK_{in}$ and the output clock signal $CK_n$ is equal to one period of the input clock signal $CK_{in}$.

FIG. 1b is a block diagram illustrating a prior art digital DLL circuit 121. The digital DLL circuit 121 includes a delay line 123, which is formed by a plurality of delay cells 125, a phase detector 127, and a DLL controller 129. Each of the delay cells 125 is used for providing a predetermined delay amount dt. Therefore, if the number of delay cells 125 in the delay line 123 is K, the total amount of the delay time on the input clock $CLK_i$ is equal to K*dt. A delayed clock $CLK_d$ and the input clock $CLK_i$ are delivered to the phase detector 127. The prior art phase detector 127 outputs a notification signal $S_c$ to the DLL controller 129 when a 180° phase difference (i.e. a phase change) between the delayed clock $CLK_d$ and the input clock $CLK_i$ is detected twice. That is, the notification signal $S_c$ informs the DLL controller 129 of the situation that the delayed clock $CLK_d$ is lagging 360° behind the input clock $CLK_i$. Therefore, the DLL controller 129 continuously programs the amount of delay dt of each delay cell 125 to increase the total amount of delay on the input clock $CLK_i$ until the notification signal $S_c$ is generated from the phase detector 127. The DLL controller 129 can further have a digital loop filter 131 included therein.

The prior art technique utilizes complementary metal oxide semiconductor (CMOS) transistors to implement the delay cells 101-107. However, the CMOS transistor has a relatively large delay amount; therefore, it will cause output signal jitter in the high-frequency signal and further affect the resolution of the DLL.

SUMMARY OF THE INVENTION

It is therefore one of the objectives of the present invention to provide a novel delay cell, which has a smaller delay amount.

According to one exemplary embodiment of the present invention, a delay line is provided. The delay line includes at least one delay cell, wherein the delay line utilizes at least one of the at least one delay cell to delay an input signal for generating an output signal, and the at least one delay cell is implemented by a Pseudo NMOS transistor.

According to another exemplary embodiment of the present invention, a memory control circuit is disclosed. The memory control circuit includes a delay locked loop (DLL) having at least one delay cell, wherein the DLL utilizes at least one of the at least one delay cell to delay an input signal for generating an output signal, and the at least one delay cell is implemented by a Pseudo NMOS transistor.

According to yet another exemplary embodiment of the present invention, a memory control circuit is provided. The memory control circuit includes a delay locked loop (DLL) having at least one delay cell. The DLL utilizes at least one of the at least one delay cell to delay an input signal for generating an output signal, and the at least one delay cell is implemented by a Pseudo NMOS transistor. The Pseudo NMOS transistor includes: a PMOS transistor, a first NMOS transistor, and a second NMOS transistor. The PMOS transistor has a source terminal coupled to a first voltage level. The first NMOS transistor has a drain terminal coupled to a drain terminal of the PMOS transistor, and a gate terminal for receiving an input signal, wherein the Pseudo NMOS transistor generates a first output signal to the drain terminal of the PMOS transistor according to the input signal received at the gate terminal of the first NMOS transistor to act as an input signal of a subsequent delay cell, and the subsequent delay cell generates a second output signal according to the input signal generated from the first NMOS transistor. The second NMOS transistor has a drain terminal coupled to a source terminal of the first NMOS transistor, and a source terminal coupled to a second voltage level, wherein the second voltage is lower than the first voltage level.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 3:
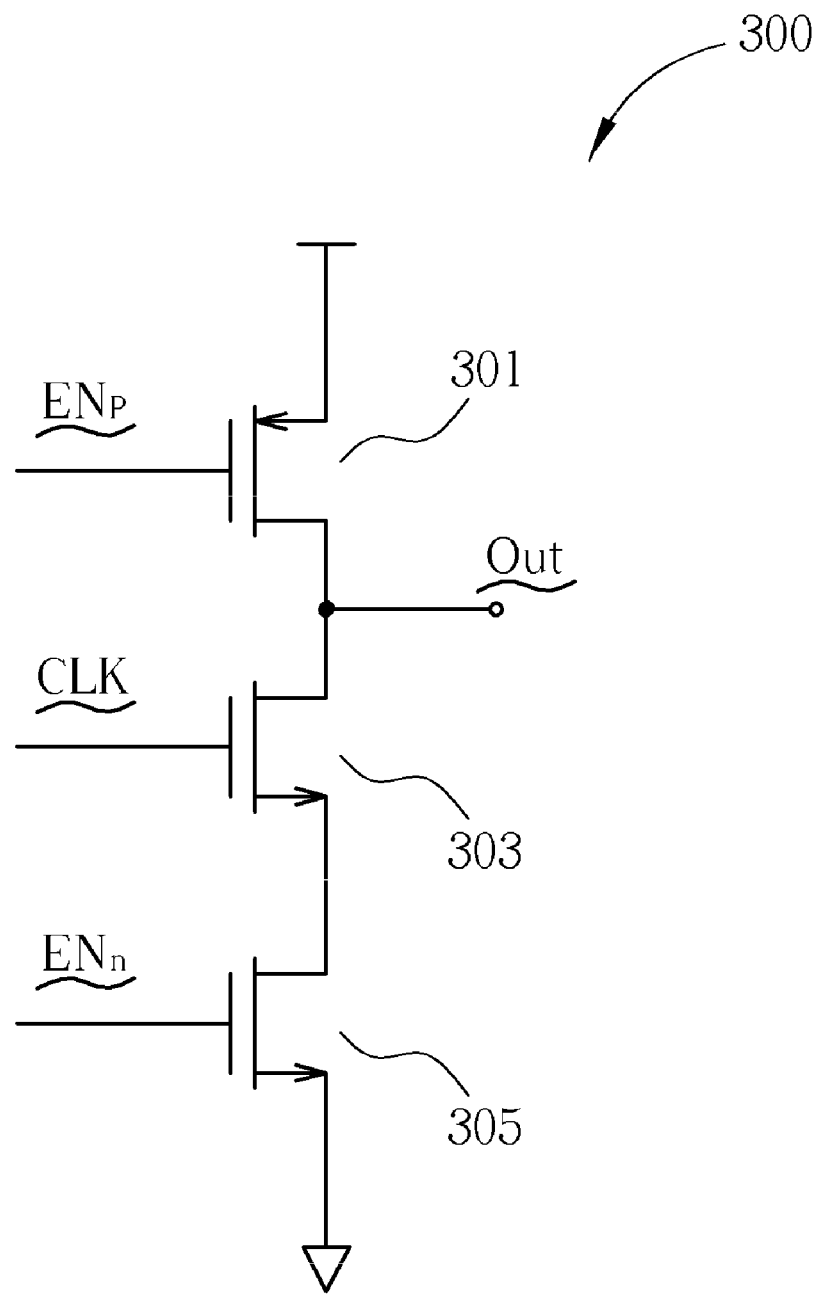
FIG. 3 is a circuit diagram of one of the Pseudo NMOS structures.

The concept of the present invention is utilizing a Pseudo NMOS transistor to implement the delay cell. As known by persons skilled in the art, the Pseudo NMOS transistor is composed of a PMOS transistor and a plurality of NMOS transistors, and is usually utilized as a logic gate. FIG. 3 is a circuit diagram of one of the Pseudo NMOS structures. As shown in FIG. 3, the Pseudo NMOS transistor 300 includes a PMOS transistor 301 and a plurality of NMOS transistors 303, 305, wherein the PMOS transistor 301 is usually coupled to a low voltage level, therefore, it will be ON continuously. Furthermore, the NMOS transistor 303 receives an input signal CLK for generating an output signal OUT to the drain terminal of the PMOS transistor 301. The NMOS transistor 305 receives an enable signal ENn to determine whether the NMOS transistor 300 is active or not.

Figure 4:
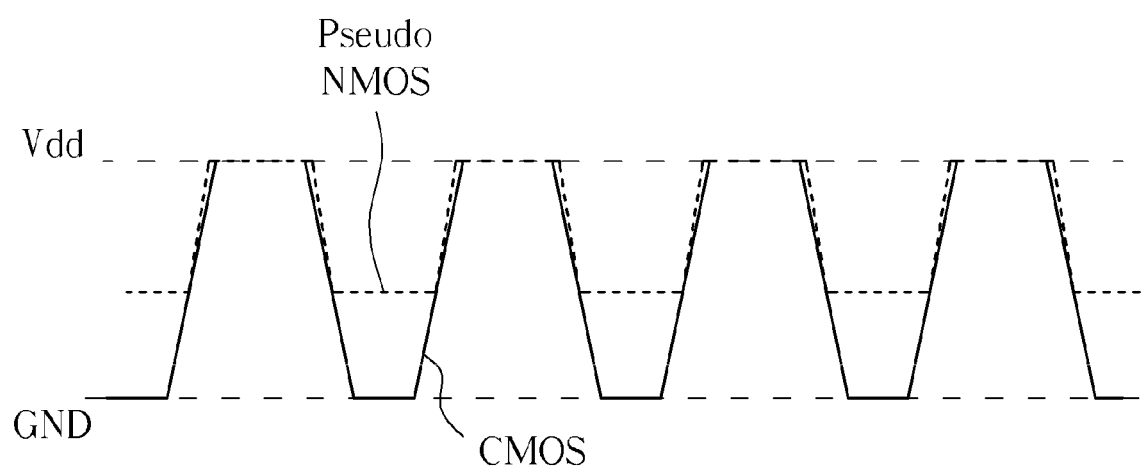
FIG. 4 is a diagram illustrating the operation of the Pseudo NMOS transistor shown in FIG. 3.

Because the input resistance is mainly formed by the NMOS transistors 303, 305, this structure has a light load characteristic (because the input resistance of the NMOS transistor is lower than the input resistance of the PMOS transistor). In addition, the PMOS transistor 301 has smaller voltage swing than the CMOS transistor because the PMOS transistor 301 is usually in the turn-on condition. As shown in FIG. 4, the lowest output voltage of the CMOS transistor is the ground voltage (solid-line waveform), and the lowest output voltage of the Pseudo NMOS transistor is higher than the ground voltage, so the Pseudo NMOS transistor 300 has smaller voltage swing. Therefore, if the Pseudo NMOS transistor is utilized to realize the delay cell, the delay cell will have a smaller delay amount due to lower input resistance and smaller voltage swing.

Figure 2:
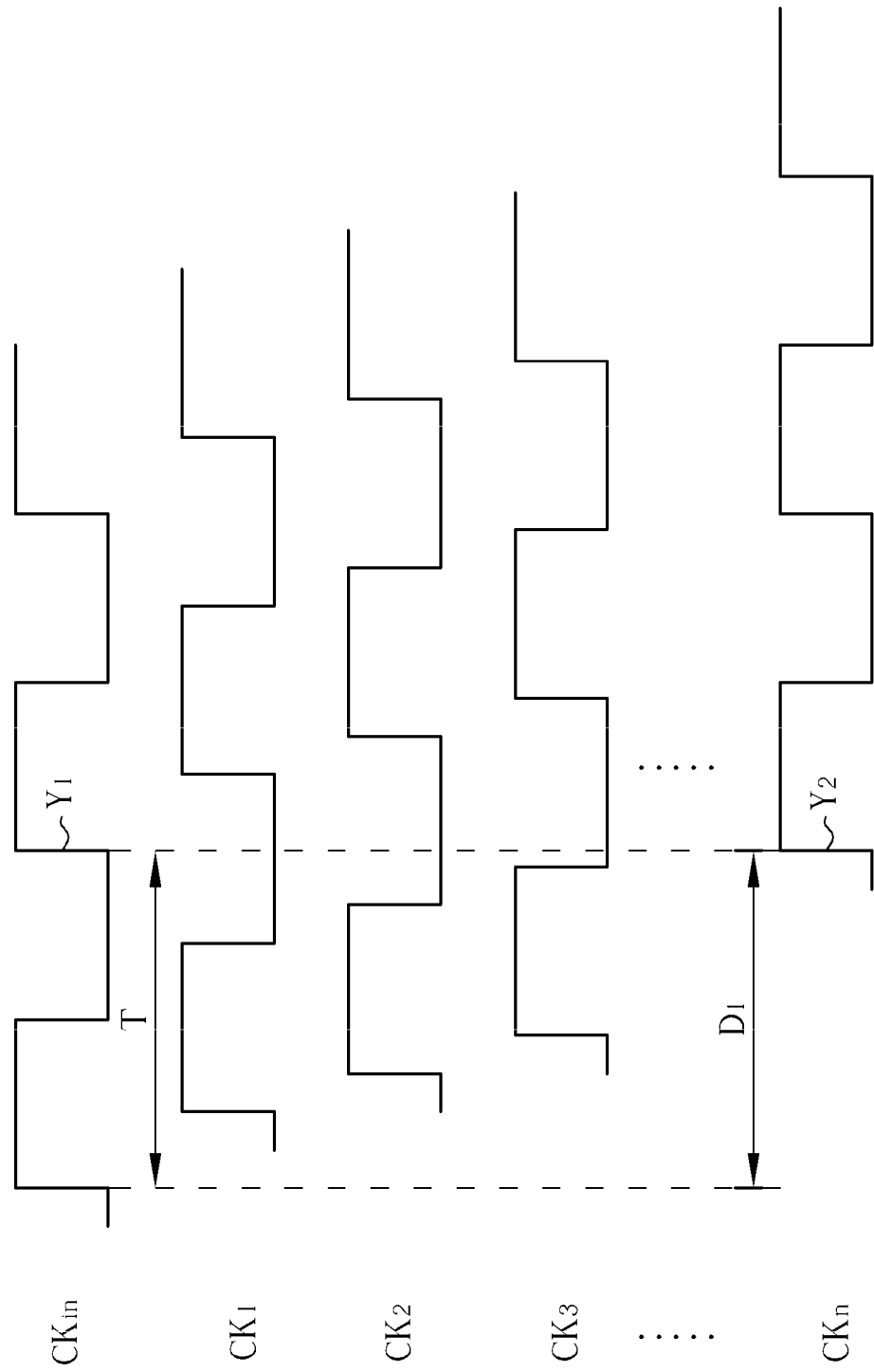
FIG. 2 is a timing diagram illustrating the general operation of the analog DLL circuit shown in FIG. 1.
Figure 5:
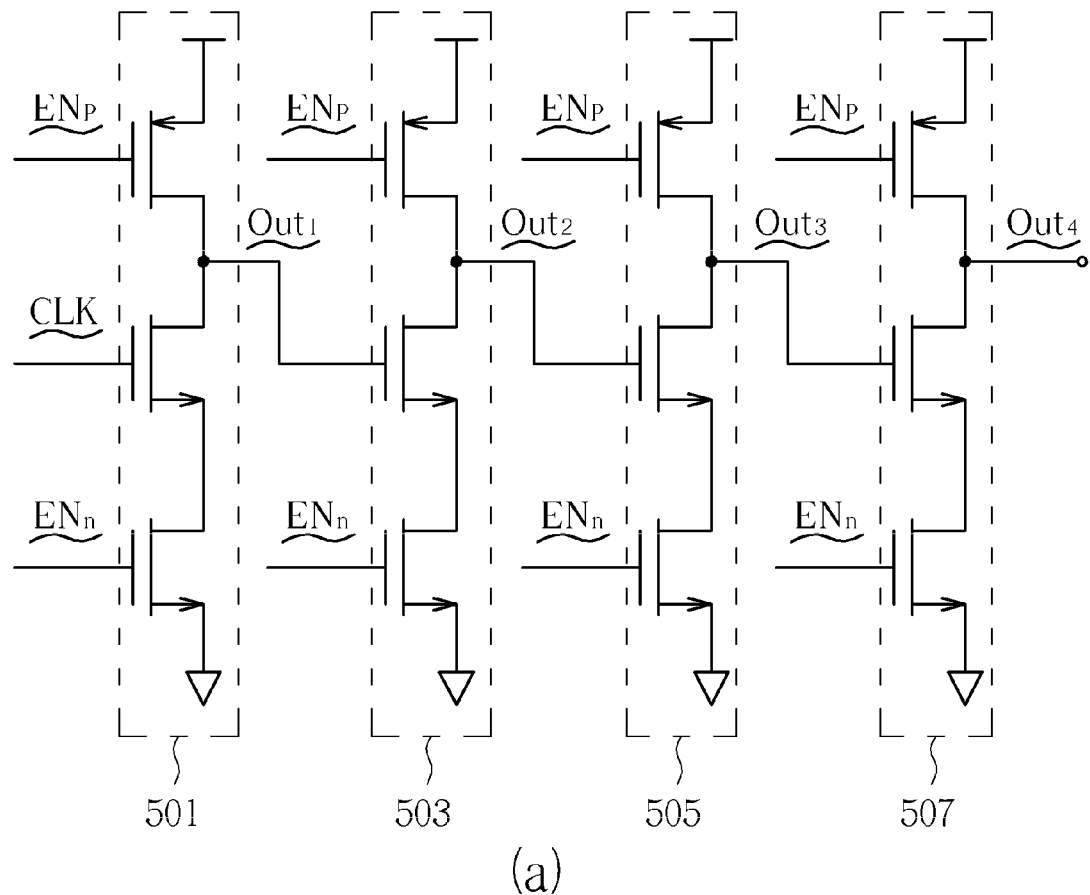
FIG. 5 is a diagram illustrating the delay line formed by Pseudo NMOS transistors each having the structure shown in FIG. 3.
Figure 5:
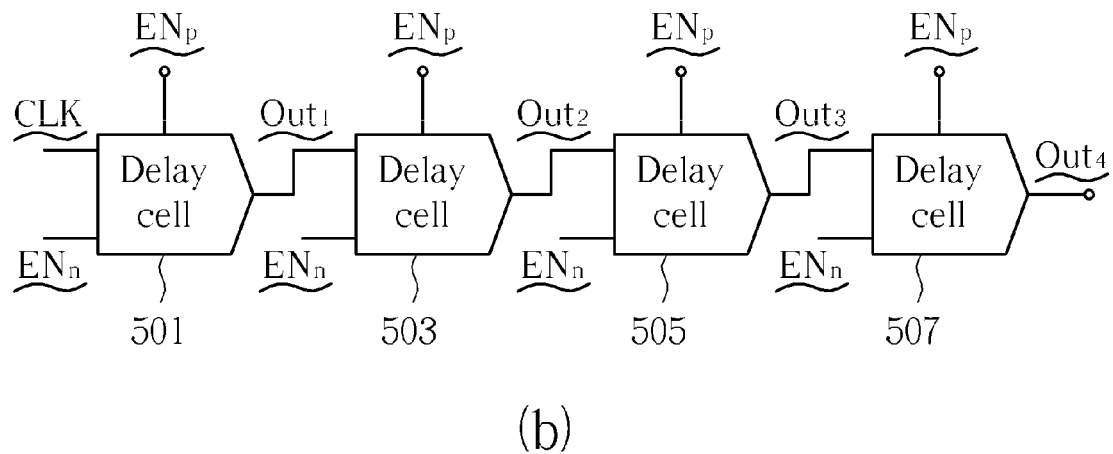

FIG. 5 is a diagram illustrating a delay line formed by Pseudo NMOS transistors each having the structure shown in FIG. 3. As shown in the sub-diagram (a) in FIG. 5, the output of each Pseudo NMOS transistor 501, 503, 505 and 507 acts as the input signal of the subsequent Pseudo NMOS transistor. Therefore, the output signals $Out_1$, $Out_2$, $Out_3$ and $Out_4$ have different delay amounts, like the $CK_1$, $CK_2$, $CK_3$ and $CK_4$ shown in FIG. 2. The sub-diagram (b) in FIG. 5 is a schematic diagram illustrating a delay line formed by delay cells implemented using a plurality of Pseudo NMOS transistors 501, 503, 505 and 507, respectively. In view of the sub-diagrams (a) and (b) in FIG. 5, the interconnection among delay cells implemented using Pseudo NMOS transistors is self-explanatory.

Please refer to FIG. 3 again. Because the PMOS transistor 301 included in the Pseudo NMOS transistor 300 is always turned on, the PMOS transistor 301 and the NMOS transistors 303, 305 will be turned on at the same time to generate the short current when the NMOS transistor 303 is turned on by the input signal CLK with a high level. The Pseudo NMOS transistor 300 utilized as the delay cell has larger energy loss because of the large short current. Therefore, the present invention further proposes using an enable signal to turn off the PMOS transistor 301. As shown in FIG. 3, the gate terminal of the PMOS transistor 301 receives an enable signal ENp to turn off the PMOS transistor 301 after the NMOS transistor 303 is turned on (i.e. after the output signal Out changes to the low level), for avoiding the short current phenomenon. The enable signal ENp can be generated by other circuit or a preceding delay cell.

Figure 6:
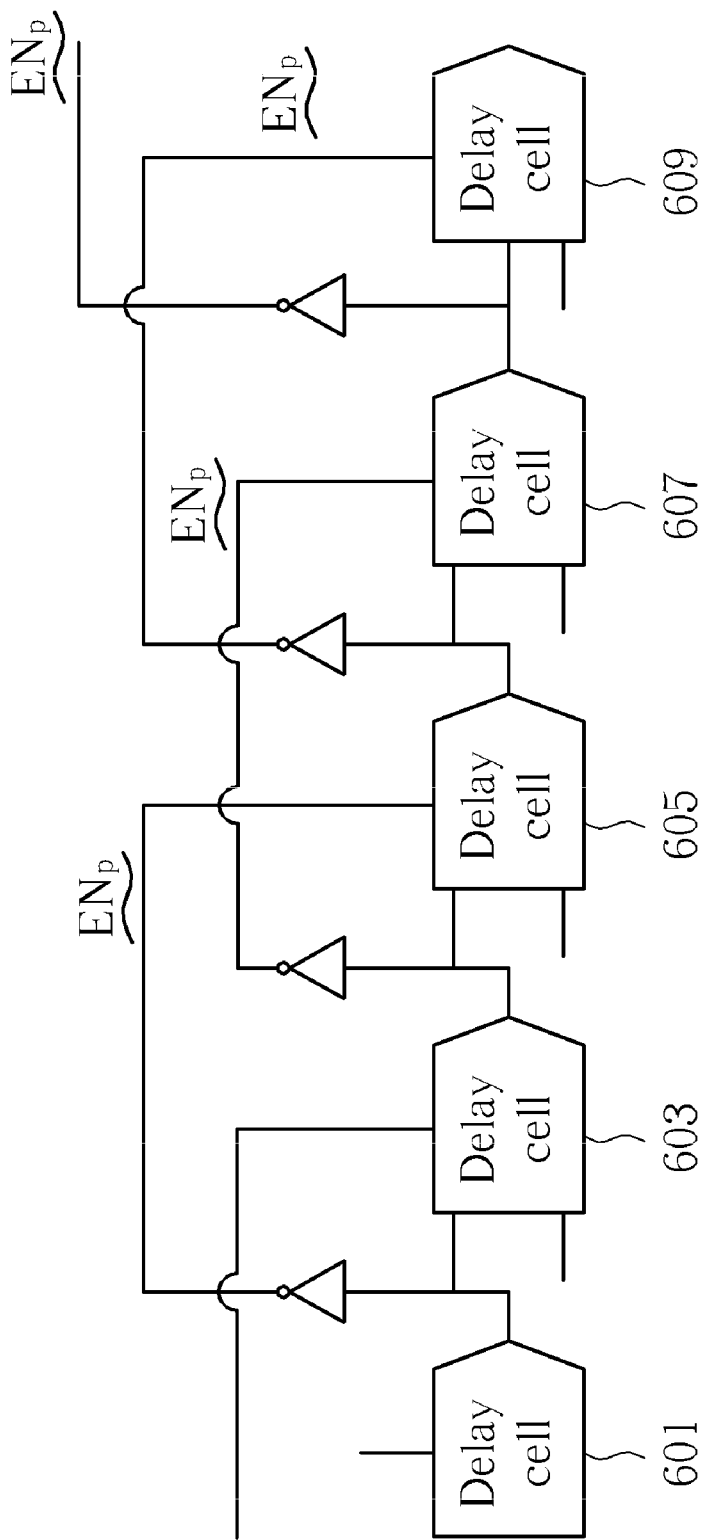
FIG. 6 is a diagram illustrating one implementation which utilizes an output signal of a preceding delay cell to serve as an enable signal of the PMOS transistor included in the Pseudo NMOS transistor.
Figure 7:
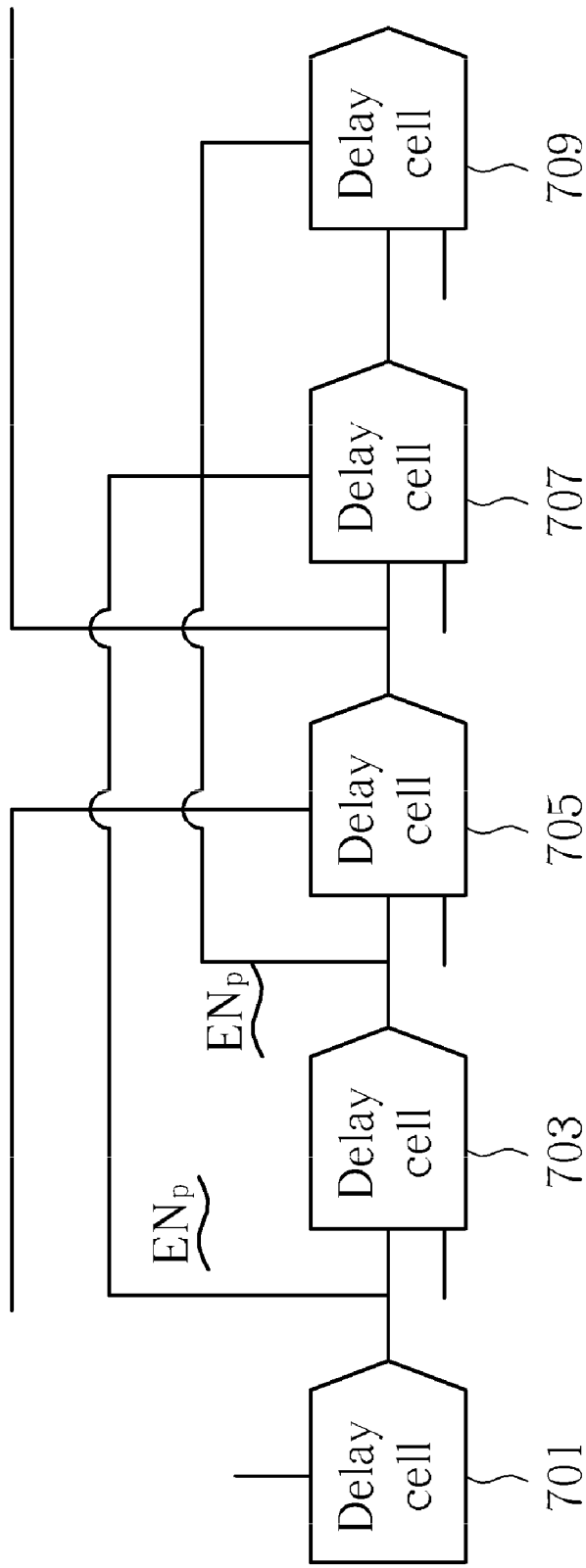
FIG. 7 is a diagram illustrating another implementation which utilizes an output signal of a preceding delay cell to serve as an enable signal of the PMOS transistor included in the Pseudo NMOS transistor.

FIG. 6 and FIG. 7 are diagrams illustrating the output signal of the preceding delay cell that is utilized as the enable signal of the PMOS transistor included in the Pseudo NMOS transistor. As shown in FIG. 6, the output signal of a delay cell which precedes a previous delay cell of a current delay cell is inverted to serve as the enable signal ENp of the current delay cell. For example, the output signal of the delay cell 601 is inverted to serve as the enable signal ENp of the delay cell 605, and the output signal of the delay cell 603 is inverted to serve as the enable signal ENp of the delay cell 607. As shown in FIG. 7, the output signal of a delay cell followed by two delay cells and the current delay cell is inverted to serve as the enable signal ENp of the current delay cell. For example, the output signal of the delay cell 701 is inverted to serve as the enable signal ENp of the delay cell 707, and the output signal of the delay cell 703 is inverted to serve as the enable signal ENp of the delay cell 709. It should be noted that the circuit diagrams shown in FIG. 6 and FIG. 7 are for illustrative purposes only: any variations under the same concept also fall within the scope of the present invention.

Figure 8:
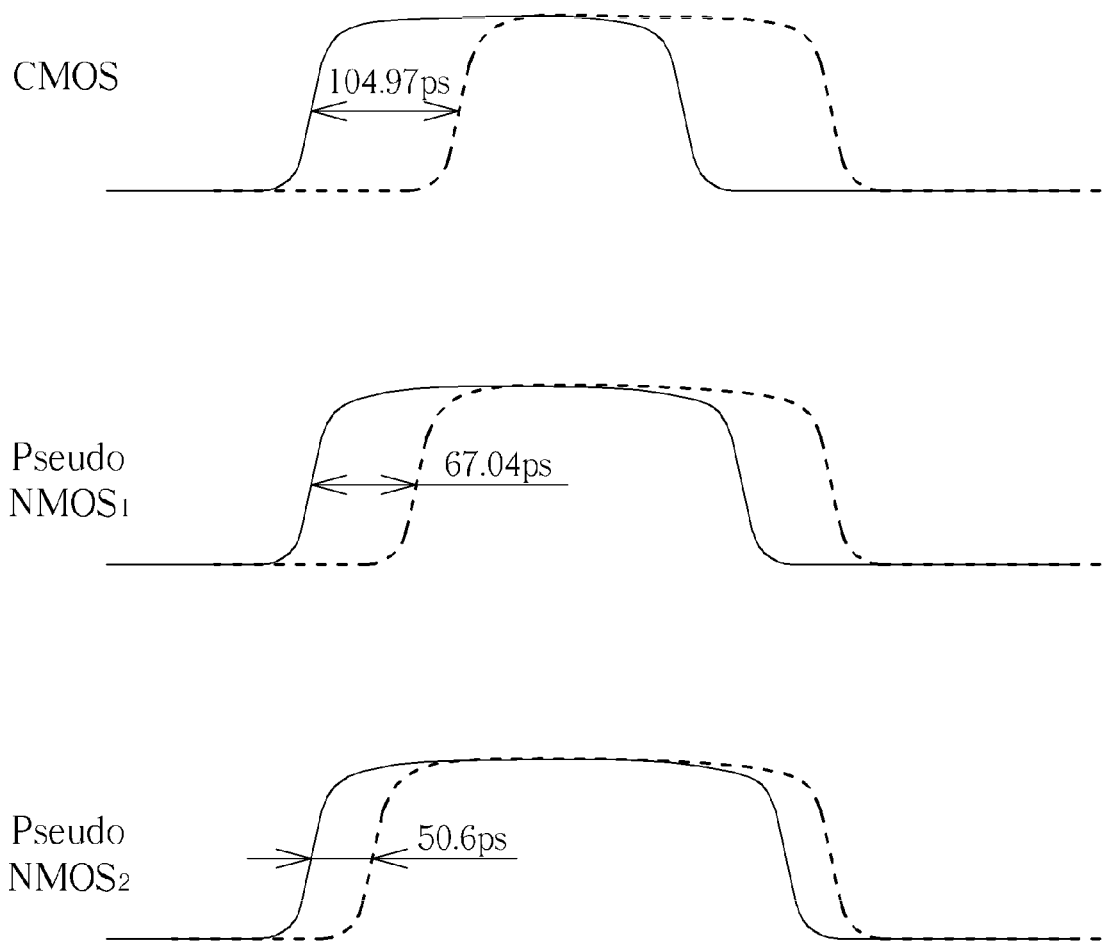
FIG. 8 is a diagram illustrating characteristic comparison of the prior art delay cell and the delay cell according to the exemplary embodiment of the present invention.

FIG. 8 is a diagram illustrating characteristic comparison of the prior art delay cell and the delay cell according to the embodiment of the present invention, which illustrates actual measurement data. As shown in FIG. 8, the delay amount of the general delay cell of the CMOS transistor is about 104 ps, but the delay amount of the delay cell implemented by the Pseudo NMOS transistor is only 60 ps and may be as low as 50 ps. Please note that in FIG. 8 the delay cell implemented by the Pseudo NMOS transistor has two delay amounts whose magnitude depends upon the close (i.e. turn-off) status of the Pseudo NMOS transistor. When the PMOS transistor is not closed completely, the short current of the PMOS transistor becomes more serious, but the PMOS transistor is turned on much faster. Therefore, the PMOS transistor has smaller delay amount. On the other hand, when the PMOS transistor is closed more completely, for example, due to a larger positive voltage applied to the gate terminal, the short current of the PMOS transistor becomes less significant, but the PMOS transistor takes more time to turn on again. Therefore, the PMOS transistor has larger delay amount. To put it briefly, the delay amount of the delay cell of the present invention is related to the conductive state of the PMOS transistor. Furthermore, as the conductive state of the PMOS transistor is dominated by the enable signal ENp, the delay amount of the delay cell of the present invention is also related to the enable signal ENp.

Figure 1A:
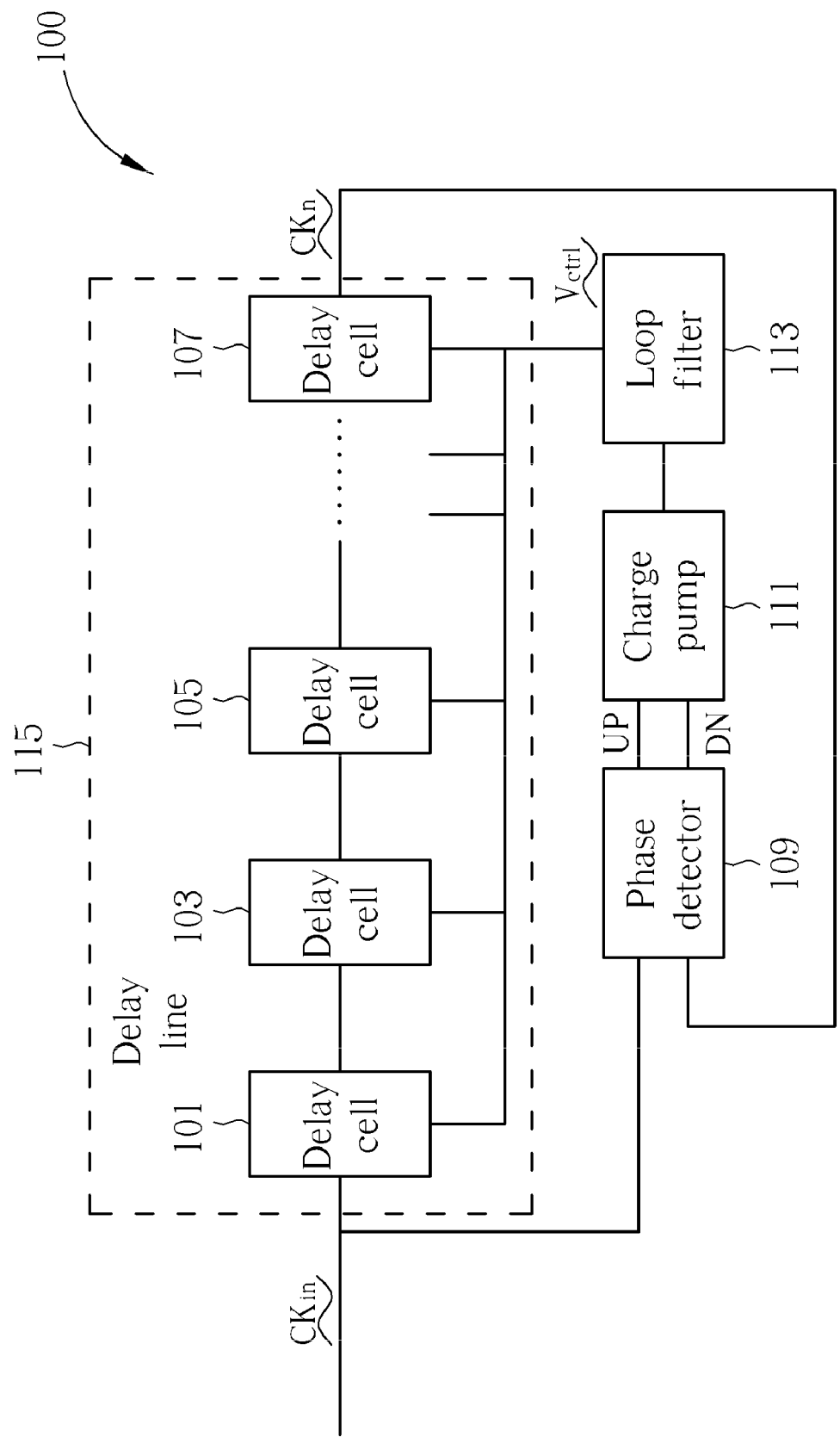
FIG. 1a is a block diagram illustrating an analog DLL circuit according to the prior art.
Figure 1B:
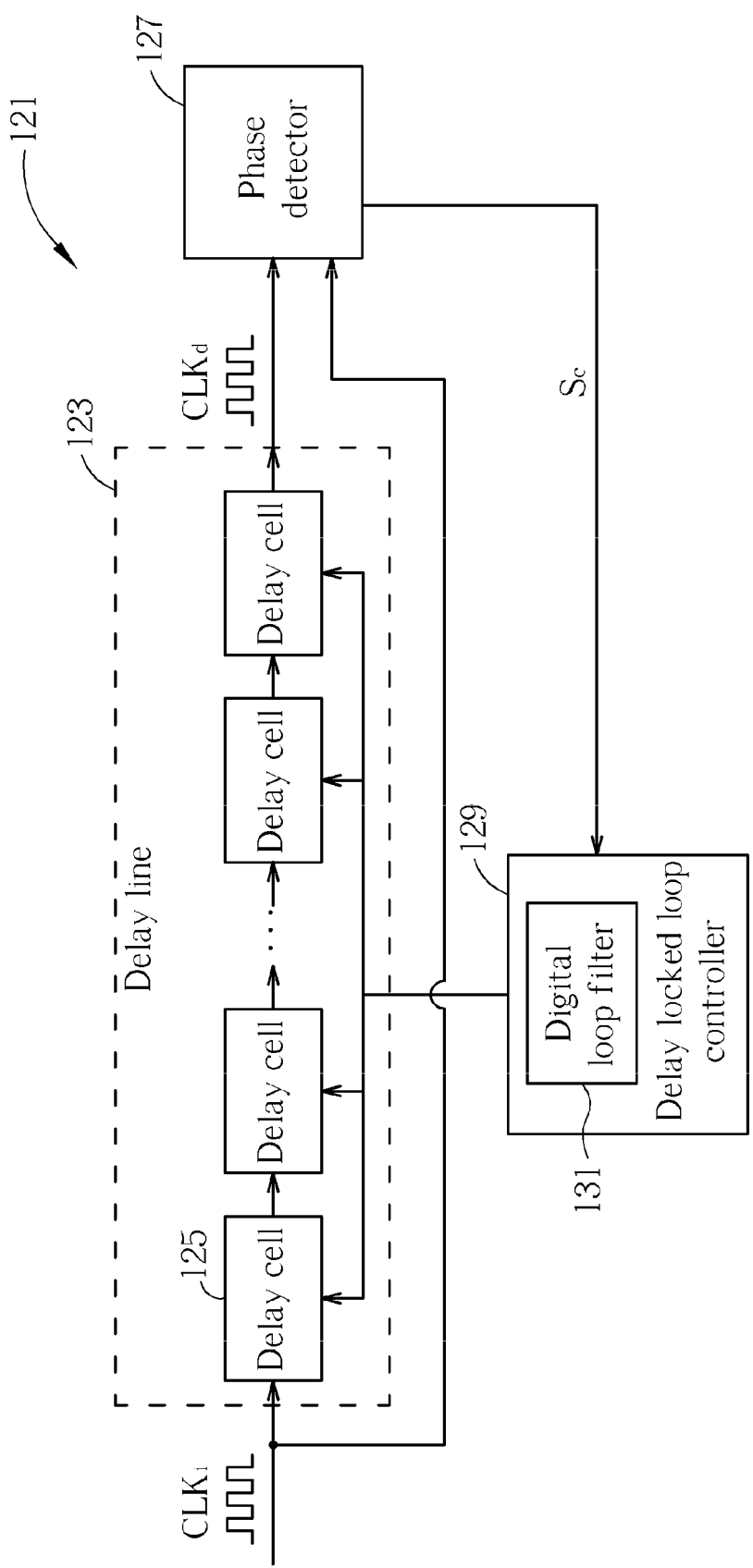
FIG. 1b is a block diagram illustrating a digital DLL circuit according to the prior art.

According to the above-mentioned exemplary embodiment, the delay cell implemented by a Pseudo NMOS transistor has advantages such as smaller delay amount and ease of control, and an enable signal can be employed to avoid the short current and control the actual delay amount. It should be noted that the above-mentioned embodiment is illustrated using a Pseudo NMOS transistor having a PMOS transistor and two NMOS transistors included therein; however, this is not meant to be a limitation of the present invention. The Pseudo NMOS transistor has a plurality of types (e.g., a PMOS transistor and four NMOS transistors are included, and the NMOS transistors can be connected using a series or parallel configuration), and these alternative designs also fall within the scope of the present invention. Furthermore, the concept of the present invention is not limited to the delay locked loop (DLL) circuit shown in FIG. 1a and FIG. 1b, but can also be applied to other DLL circuits.

Those skilled in the art will readily observe that numerous modifications and alterations of the device and method may be made while retaining the teachings of the invention.

What is claimed is:

1. A delay line, comprising:
   at least one delay cell, wherein the delay line utilizes at least one of the at least one delay cell to delay an input signal for generating an output signal, and the at least one delay cell is implemented by a Pseudo NMOS transistor comprising:
      a PMOS transistor, having a source terminal coupled to a first voltage level; and
      a plurality of NMOS transistors, coupled between a drain terminal of the PMOS transistor and a second voltage level, wherein the first voltage level is higher than the second voltage level, one of the NMOS transistors receives the input signal, the Pseudo NMOS transistor generates the output signal at the drain terminal of the PMOS transistor according to the input signal received by the one of the NMOS transistors, and the output signal of the Pseudo NMOS transistor is transmitted to an NMOS transistor included in a subsequent delay cell.

2. The delay line of claim 1, being implemented in a delay locked loop (DLL).

3. The delay line of claim 2, wherein the delay locked loop is implemented in a memory control circuit.

4. The delay line of claim 1, wherein the NMOS transistors comprise:
   a first NMOS transistor, having a drain terminal coupled to a drain terminal of the PMOS transistor, and a gate terminal for receiving the input signal, wherein the Pseudo NMOS transistor generates a first output signal to the drain terminal of the PMOS transistor according to the input signal received at the gate terminal of the first NMOS transistor to act as an input signal of the subsequent delay cell, and the subsequent delay cell generates a second output signal according to the input signal generated from the first NMOS transistor; and
   a second NMOS, having a drain terminal coupled to a source terminal of the first NMOS transistor, and a source terminal coupled to the second voltage level.

5. The delay line of claim 1, wherein the PMOS transistor further receives an enable signal, and the PMOS transistor is turned off when the enable signal is at a special voltage level.

6. The delay line of claim 5, wherein the enable signal of one of the at least one delay cell is derived from an output signal generated from a preceding delay cell.

7. The delay line of claim 6, further comprising an inverter configured for inverting the output signal generated from the preceding delay cell to be the enable signal.

8. The delay line of claim 5, wherein a delay amount of the at least one delay cell is related to the enable signal.

9. A memory control circuit, comprising:
   a delay locked loop (DLL), comprising:
      at least one delay cell, wherein the delay locked loop utilizes at least one of the at least one delay cell to delay an input signal for generating an output signal, and the at least one delay cell is implemented by a Pseudo NMOS transistor comprising:
         a PMOS transistor, having a source terminal coupled to a first voltage level; and
         a plurality of NMOS transistors, coupled between a drain terminal of the PMOS transistor and a second voltage level, wherein the first voltage level is higher than the second voltage level, one of the NMOS transistors receives the input signal, the Pseudo NMOS transistor generates the output signal at the drain terminal of the PMOS transistor according to the input signal received by the one of the NMOS transistors, and the output signal of the Pseudo NMOS transistor is transmitted to an NMOS transistor included in a subsequent delay cell.

10. The memory control circuit of claim 9, wherein the NMOS transistors comprise:
    a first NMOS transistor, having a drain terminal coupled to a drain terminal of the PMOS transistor, and a gate terminal for receiving the input signal, wherein the Pseudo NMOS transistor generates a first output signal to the drain terminal of the PMOS transistor according to the input signal received at the gate terminal of the first NMOS transistor as an input signal of the subsequent delay cell, and the subsequent delay cell generates a second output signal according to the input signal generated from the first NMOS transistor; and
    a second NMOS transistor, having a drain terminal coupled to a source terminal of the first NMOS transistor, and a source terminal coupled to the second voltage level.

11. The memory control circuit of claim 9, wherein the PMOS transistor further receives an enable signal, and the PMOS transistor is turned off when the enable signal is at a special voltage level.

12. The memory control circuit of claim 11, wherein the enable signal of one of the at least one delay cell is derived from an output signal generated from a preceding delay cell.

13. The memory control circuit of claim 12, further comprising an inverter for inverting the output signal generated from the preceding delay cell to be the enable signal.

14. The memory control circuit of claim 11, wherein a delay amount of the at least one delay cell is related to the enable signal.

15. A memory control circuit, comprising:
    a delay locked loop (DLL), comprising:
       at least one delay cell, wherein the delay locked loop utilizes at least one of the at least none delay cell to delay an input signal for generating an output signal, the delay cell is implemented by a Pseudo NMOS transistor, and the Pseudo NMOS transistor comprises:
          a PMOS transistor, having a source terminal coupled to a first voltage level;

a first NMOS transistor, having a drain terminal coupled to a drain terminal of the PMOS transistor, and a gate terminal for receiving an input signal, wherein the Pseudo NMOS transistor generates a first output signal to the drain terminal of the PMOS transistor according to the input signal received at the gate terminal of the first NMOS transistor to act as an input signal of a subsequent delay cell, the first output signal of the Pseudo NMOS transistor is transmitted to an NMOS transistor included in the subsequent delay cell, and the subsequent delay cell generates a second output signal according to the input signal generated from the first NMOS transistor; and a second NMOS transistor, having a drain terminal coupled to a source terminal of the first NMOS transistor, and a source terminal coupled to a second voltage level, wherein the second voltage is lower than the first voltage level.

16. The memory control circuit of claim 15, wherein the PMOS transistor further receives an enable signal, and the PMOS transistor is turned off when the enable signal is at a special voltage level.

17. The memory control circuit of claim 16, wherein the enable signal of one of the at least one delay cell is derived from an output signal generated from a preceding delay cell.

18. The memory control circuit of claim 17, further comprising an inverter for inverting the output signal generated from the preceding delay cell to be the enable signal.

19. The memory control circuit of claim 16, wherein the delay amount of the delay cell is related to the enable signal.

* * * * *